(12) United States Patent
Cheng (10) Patent No.: US 11,411,332 B2
(45) Date of Patent: Aug. 9, 2022

(54) ELECTRICAL CONNECTOR

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventor: Chih-Pi Cheng, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 17/080,765

(22) Filed: Oct. 26, 2020

(65) Prior Publication Data

US 2021/0126389 A1    Apr. 29, 2021

(30) Foreign Application Priority Data

Oct. 25, 2019  (CN) .......................... 201911021216.5

(51) Int. Cl.
*H01R 13/62* (2006.01)
*H01R 12/71* (2011.01)
(Continued)

(52) U.S. Cl.
CPC ......... *H01R 12/716* (2013.01); *H01R 13/436* (2013.01); *H01R 12/7047* (2013.01); *H01R 13/508* (2013.01)

(58) Field of Classification Search
CPC ................ H01R 12/716; H01R 13/436; H01R 12/7047; H01R 13/508; H01R 13/502; H01R 13/40; G06F 1/183
See application file for complete search history.

(56) References Cited

U.S. PATENT DOCUMENTS 6,383,027 B2 *  5/2002  Cabane ................ G06K 7/0021
                                                    439/260
6,485,320 B1 * 11/2002  Ma ....................... H05K 7/1061
                                                    439/342
(Continued)

FOREIGN PATENT DOCUMENTS

CN    204885593 U    12/2015
CN    205081251 U     3/2016
(Continued)

*Primary Examiner* — Abdullah A Riyami
*Assistant Examiner* — Nelson R. Burgos-Guntin
(74) *Attorney, Agent, or Firm* — Ming Chieh Chang; Wei Te Chung (57) ABSTRACT

An electrical connector includes a connection main part surrounded by the seat frame, and a CPU carrier for carrying the CPU and a load plate for downwardly pressing the CPU respectively pivotally located at two opposite ends of the seat frame in the front-to-back direction. A set of rotation mechanism is rotatably assembled upon one end to receive the CPU carrier. A pair of supporting arms are unitarily formed with one end of the seat frame, forming a pair of locking recesses having one open side. The seat frame includes a stopper opposite to the pair of locking recesses in the lengthwise direction. The rotation mechanism is pre-assembled as one piece and successively assembled upon the seat frame along the lengthwise direction with the pivot engaged within the pair of locking recesses and a middle section of the torsion spring engaged with the stopper.

18 Claims, 8 Drawing Sheets

(51) Int. Cl.
*H01R 13/436* (2006.01)
*H01R 12/70* (2011.01)
*H01R 13/508* (2006.01)

(56) References Cited

U.S. PATENT DOCUMENTS

| | | | | |
|---|---|---|---|---|
| 6,527,577 B1* | 3/2003 | Chen | H05K 7/1007 | 439/259 |
| 6,648,656 B1* | 11/2003 | Ma | H05K 7/1053 | 439/331 |
| 6,722,909 B1* | 4/2004 | McHugh | H05K 7/1007 | 439/331 |
| 6,776,642 B1* | 8/2004 | McHugh | H01R 12/7076 | 439/331 |
| 6,799,978 B2* | 10/2004 | Ma | H05K 7/1007 | 439/331 |
| 6,869,303 B1* | 3/2005 | Ma | H01R 12/88 | 439/331 |
| 6,875,038 B1* | 4/2005 | McHugh | H01R 12/88 | 439/331 |
| 6,932,622 B2* | 8/2005 | Liao | H05K 7/1053 | 439/331 |
| 6,957,973 B1* | 10/2005 | McHugh | H01R 12/88 | 439/331 |
| 7,097,517 B2* | 8/2006 | Ma | H01R 13/41 | 439/331 |
| 7,112,068 B2* | 9/2006 | Ma | H01R 13/6315 | 439/331 |
| 7,182,620 B1* | 2/2007 | Ju | H01R 12/88 | 439/331 |
| 7,338,308 B2* | 3/2008 | Nakao | G01R 1/0466 | 439/331 |
| 7,422,461 B2* | 9/2008 | Chen | G06K 7/0021 | 235/441 |
| 7,470,128 B2* | 12/2008 | Ju | H01R 13/639 | 439/331 |
| 7,497,717 B2* | 3/2009 | Zhang | H05K 7/1053 | 439/331 |
| 7,682,178 B2* | 3/2010 | Feng | H04B 1/3818 | 439/326 |
| 7,708,580 B2* | 5/2010 | Yeh | H05K 7/1053 | 439/331 |
| 7,744,397 B2* | 6/2010 | Yeh | H01R 43/18 | 439/331 |
| 7,867,006 B2* | 1/2011 | Yeh | H05K 7/1053 | 439/331 |
| 7,878,836 B2* | 2/2011 | Lin | H05K 7/1061 | 439/331 |
| 8,052,451 B2* | 11/2011 | Yeh | H05K 7/1053 | 439/331 |
| 8,092,242 B2* | 1/2012 | Yeh | G01R 1/0466 | 439/331 |
| 8,123,543 B1* | 2/2012 | Terhune, IV | H05K 7/1061 | 439/331 |
| 8,172,597 B1* | 5/2012 | Terhune, IV | H01R 12/89 | 439/331 |
| 8,251,714 B2* | 8/2012 | Yeh | H05K 7/1069 | 439/73 |
| 8,460,012 B2* | 6/2013 | Zhou | G01R 1/0466 | 439/73 |
| 8,506,316 B2* | 8/2013 | Tsai | H05K 7/1061 | 439/331 |
| 8,587,947 B2* | 11/2013 | Yonemochi | H05K 7/1053 | 361/719 |
| 8,834,191 B2* | 9/2014 | Yeh | H01R 12/88 | 439/331 |
| 8,979,565 B2* | 3/2015 | Yeh | H05K 7/1061 | 439/331 |
| 8,979,566 B2* | 3/2015 | Yeh | H01R 12/52 | 439/331 |
| 9,214,754 B2* | 12/2015 | Yeh | H05K 7/1053 | |
| 9,717,156 B2* | 7/2017 | Zhang | H05K 7/00 | |
| 2006/0048348 A1* | 3/2006 | Kao | G06F 1/183 | 24/457 |
| 2009/0176397 A1* | 7/2009 | Yeh | H05K 7/1053 | 439/331 |
| 2009/0191744 A1* | 7/2009 | Yeh | H01R 12/7047 | 439/331 |
| 2011/0294330 A1* | 12/2011 | Dai | H05K 7/1053 | 439/331 |
| 2012/0108108 A1* | 5/2012 | Horikawa | H01R 12/716 | 439/626 |
| 2012/0149215 A1* | 6/2012 | Consoli | H01R 13/66 | 439/65 |
| 2012/0156919 A1* | 6/2012 | Yeh | H01R 12/88 | 439/370 |
| 2019/0120896 A1* | 4/2019 | Chen | H01L 23/3672 | |
| 2019/0245287 A1* | 8/2019 | Su | H01R 13/639 | |
| 2019/0313543 A1* | 10/2019 | Su | H05K 7/1007 | |
| 2020/0117247 A1* | 4/2020 | Cheng | H05K 7/2039 | |
| 2020/0329578 A1* | 10/2020 | Wu | H05K 3/301 | |
| 2020/0335432 A1* | 10/2020 | Murtagian | H01L 21/67144 | |
| 2020/0381333 A1* | 12/2020 | Cheng | H01L 23/4006 | |
| 2021/0083411 A1* | 3/2021 | Yang | H01R 13/62933 | |
| 2021/0126389 A1* | 4/2021 | Cheng | H01R 12/716 | |
| 2021/0210478 A1* | 7/2021 | Jadhav | H01L 23/473 | |
| 2021/0267083 A1* | 8/2021 | Lyons | G06F 1/183 | |

FOREIGN PATENT DOCUMENTS

| | | |
|---|---|---|
| CN | 205452718 U | 8/2016 |
| CN | 206283018 U | 6/2017 |

* cited by examiner

ELECTRICAL CONNECTOR

BACKGROUND OF THE DISCLOSURE

1. Field of the Disclosure

The present disclosure relates to an electrical connector, and particularly to a CPU (Central Processing Unit) socket with rotation mechanism which can be easily and conveniently assembled to the seat.

2. Description of Related Arts

China Utility Patent No. CN205452718 claiming the priority of a US Provisional Application No. 62/185,036 filed on Jun. 26, 2015m discloses a CPU socket with a rotation mechanism at either end. Anyhow, such a rotation mechanism, which is used to urge either the CPU carrier or the pressing load plate to be in an vertical open state, includes plural parts requiring to be individually assembled to the corresponding tiny holding section of the seat inconveniently and disadvantageously.

An improved structure for assembling the rotation mechanism in an easy way, is desired.

SUMMARY OF THE DISCLOSURE

An object of the invention is to provide an electrical connector for receiving a CPU, having a rotation mechanism which has a simplified structure and is easy to be assembled to the seat frame. The electrical connector includes a connection main part surrounded by the seat frame, and a CPU carrier for carrying the CPU and a load plate for downwardly pressing the CPU respectively pivotally located at two opposite ends of the seat frame in the front-to-back direction. A set of rotation mechanism is rotatably assembled upon one end to receive the CPU carrier. A pair of supporting arms are unitarily formed with one end of the seat frame, forming a pair of locking recesses having one open side. The rotation mechanism includes a main body, a pivot assembled upon the main body, and a torsion spring assembled upon the pivot. The seat frame includes a stopper opposite to the pair of locking recesses in the lengthwise direction. The rotation mechanism is pre-assembled as one piece and successively assembled upon the seat frame along the lengthwise direction with the pivot engaged within the pair of locking recesses and a middle section of the torsion spring engaged with the stopper.

The main body of the rotation mechanism is insulative, and two ends of the torsion spring are retained within the main body. The torsion spring urges the rotation mechanism toward an upstanding position Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the embodiments of the present disclosure.

Referring to FIGS. 1-8, an electrical connector 100 for use with a CPU 80 and a PCB (not shown) includes a connection main part 10 surrounded by a metallic seat frame 20 fastened to the PCB (not shown), a metallic load plate 30 and an insulative CPU carrier 70 pivotally located at two opposite front end 201 and rear end 202 of the electrical connector 100 in a front-to-back direction. As well know, the connecting main part 10 includes an insulative housing with a plurality of contacts in detail. The CPU carrier 70 holds the CPU 80, and the load plate 30 downwardly presses the CPU 80. A rotation mechanism 40 is assembled to the rear end 202 to receive the CPU carrier 70.

A pair of supporting arms 22 functioning as a rear/first stopper with a space therebetween to receive the rotation mechanism therein, are unitarily formed at the rear end 202 of the plate 21 of the seat frame 20. Each supporting arm 22 includes a forwardly opening locking recess 221. The frame 20 further forms a front/second stopper 23 opposite to the pair of supporting arms 22 in the front-to-back direction. The rotation mechanism 40 includes a main body 41, a pivot 42 assembled upon the main body 41, and a torsion spring 43 assembled upon the pivot 41. The main body is formed by plastic and forms a receiving slot 411 to receive the CPU carrier 70. The CPU carrier 70 includes a plurality of hooks 72 to retain the CPU 80, and a plurality of latches 71 to be engaged with the ribs 4111 in the receiving slot 411.

Figure 7:
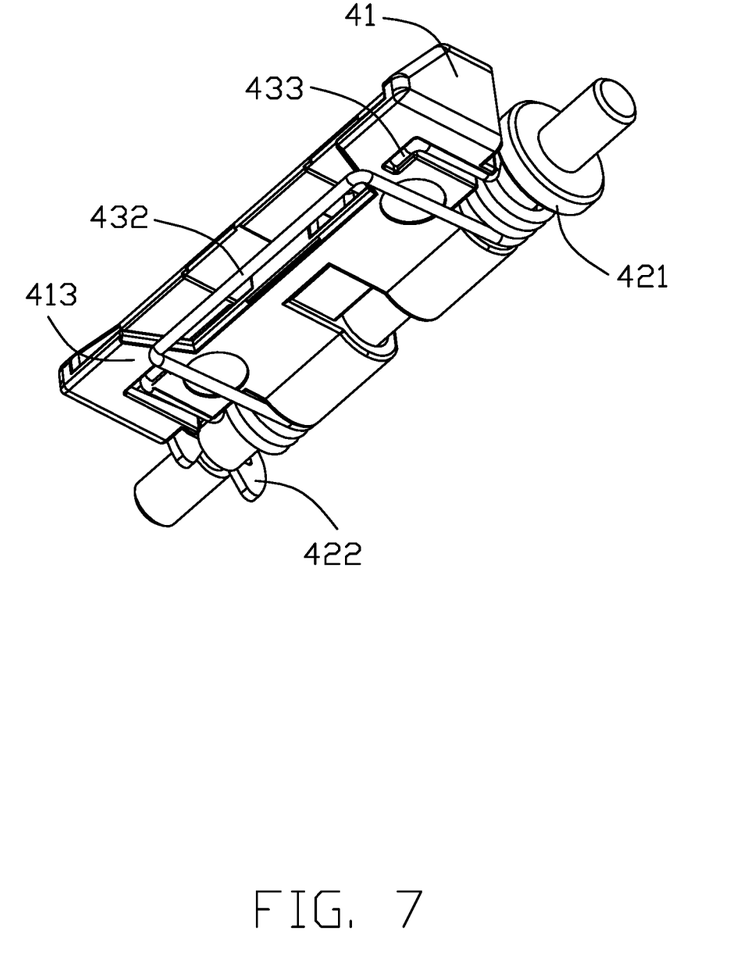
FIG. 7 is a perspective view of the rotation mechanism of the electrical connector FIG. 5.
Figure 8:
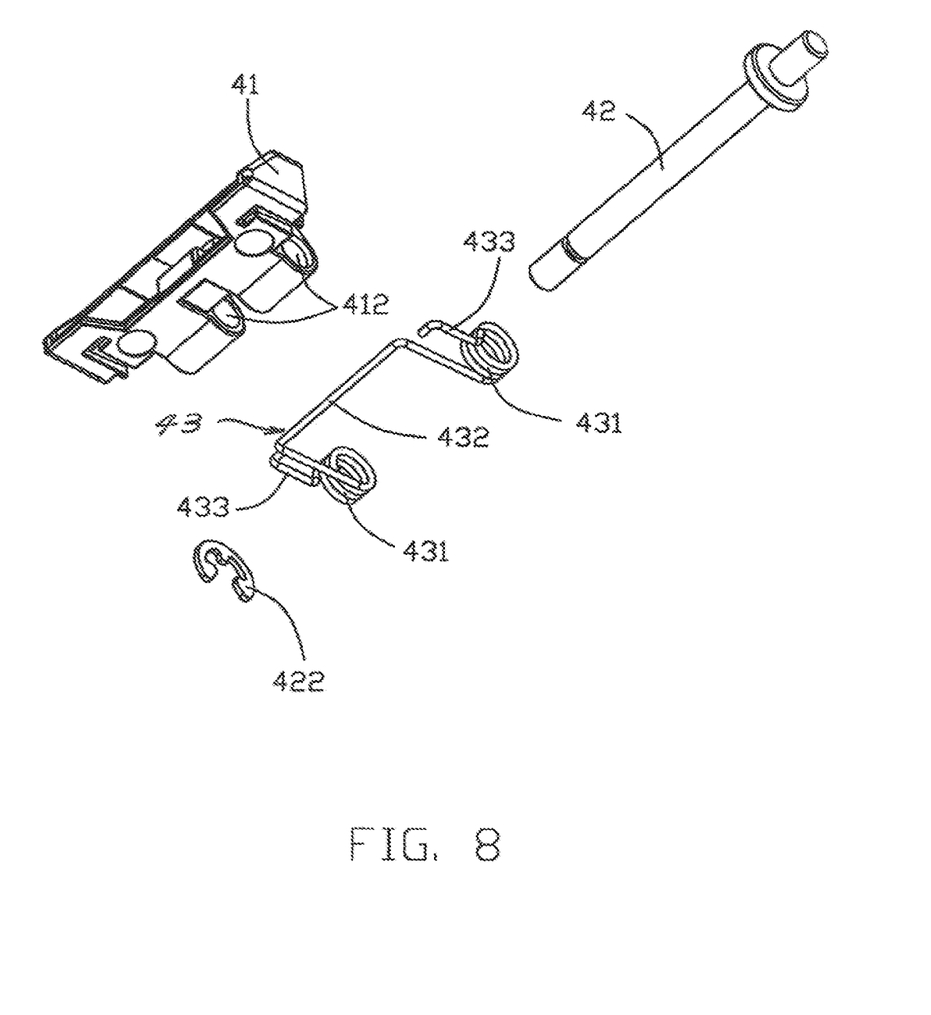
FIG. 8 is an exploded perspective view of the rotation mechanism of the electrical connector FIG. 7.

The main body 41 forms a pair of pivot holes 412 through which the pivot 42 extends. The torsion spring 43 includes a pair of coil sections 431 aligned with the pair of pivot holes 412 in the transverse direction, a pair of retention ends 433 at two opposite ends to abut against the main body 41, and a middle section 432 between the pair of coil sections 431. The pivot 42 extends through one coil section 431, the pair of pivot holes 412 and the other coil section 431 sequentially. One C-ring 422 is assembled to the pivot 42 so as to cooperate with a retention ring 421 of the pivot 42 for reliably assembling the pivot 42 upon the main body 41. Understandably, the middle section 432 and the retention ends 433 are usually perpendicular to each other when the torsion spring 43 is a relaxed manner.

Figure 1:
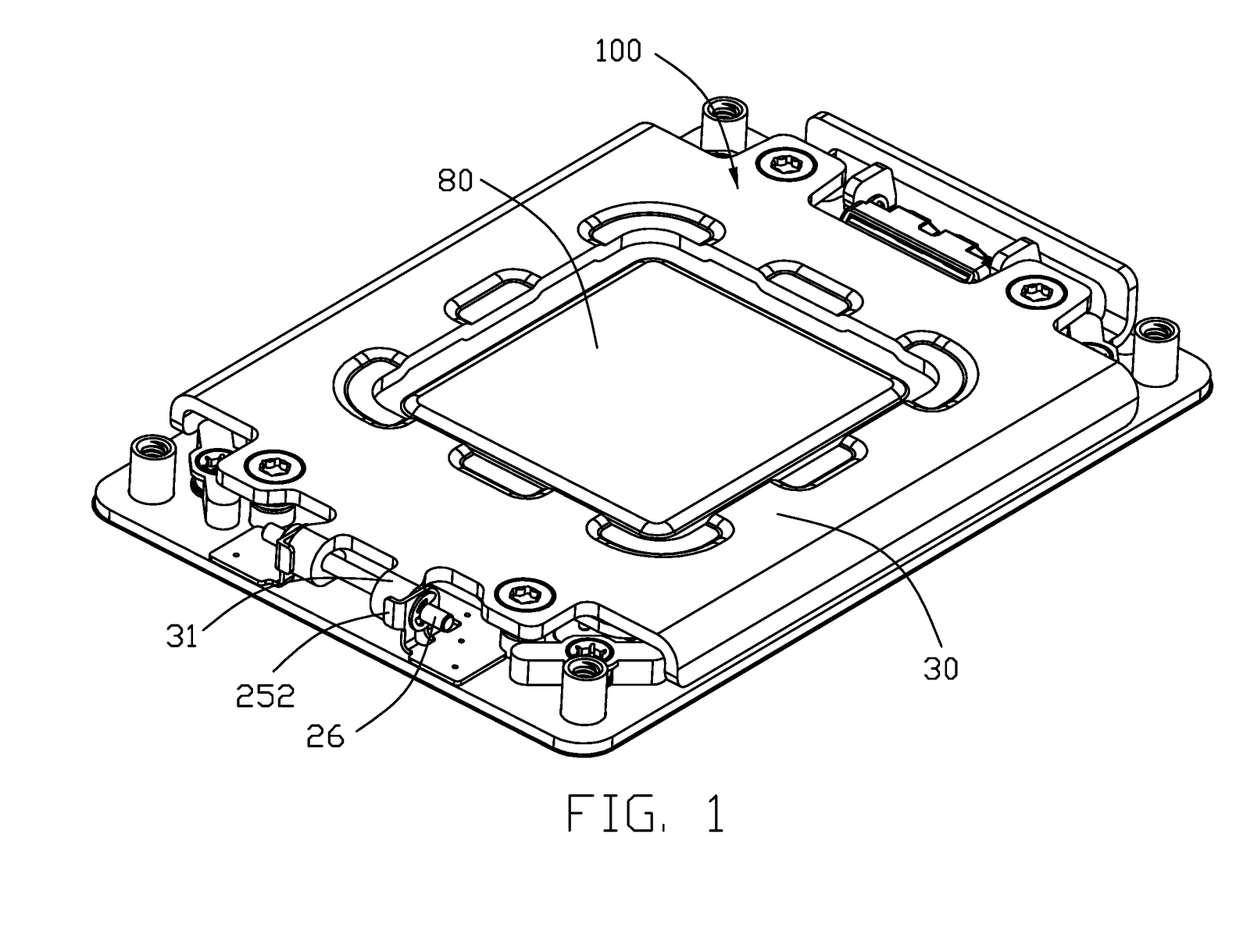
FIG. 1 is a perspective view of an electrical connector of the invention equipped with a CPU therein in a closed position.
Figure 2:
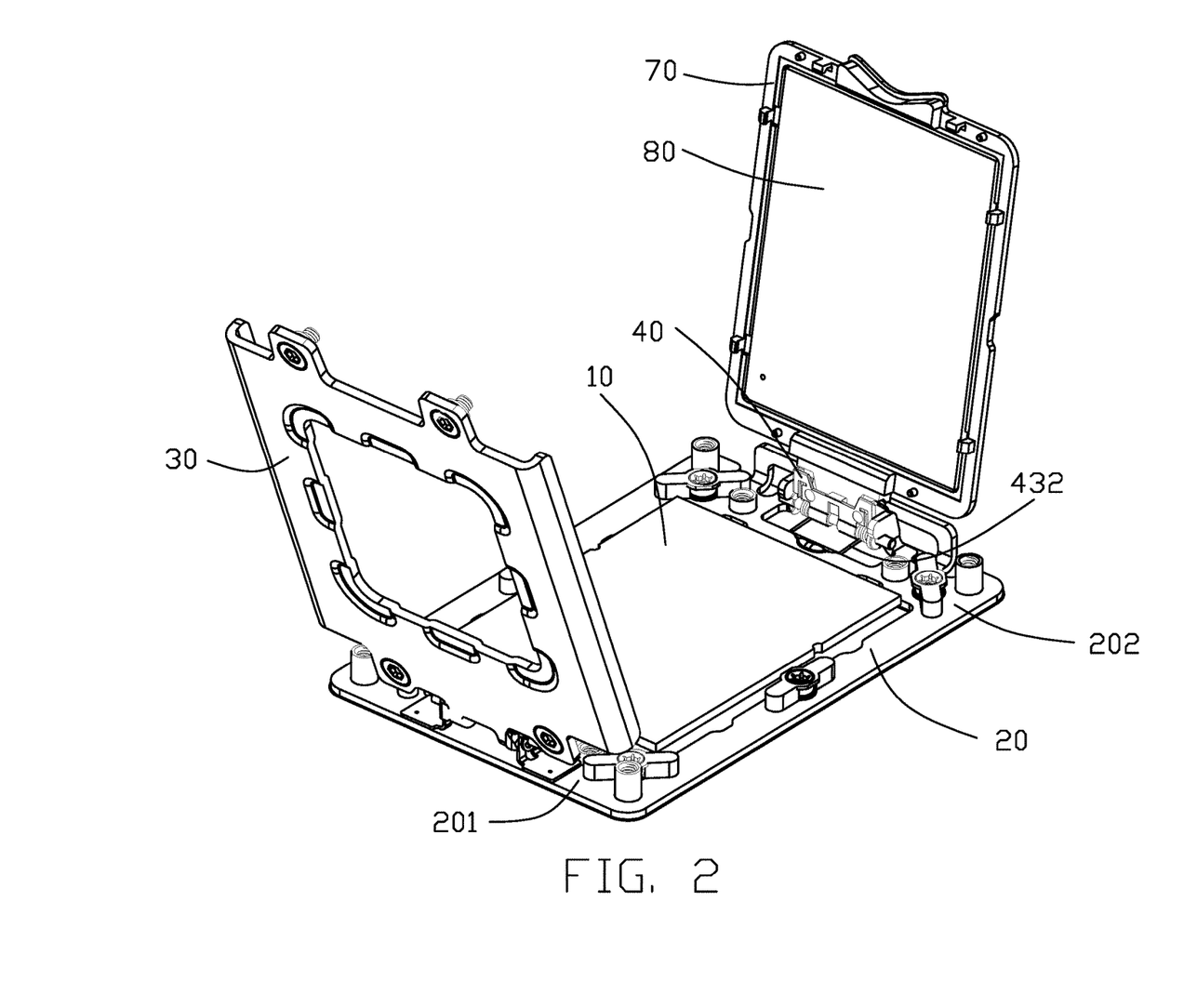
FIG. 2 is a perspective view of the electrical connector of FIG. 1 in an open position.
Figure 3:
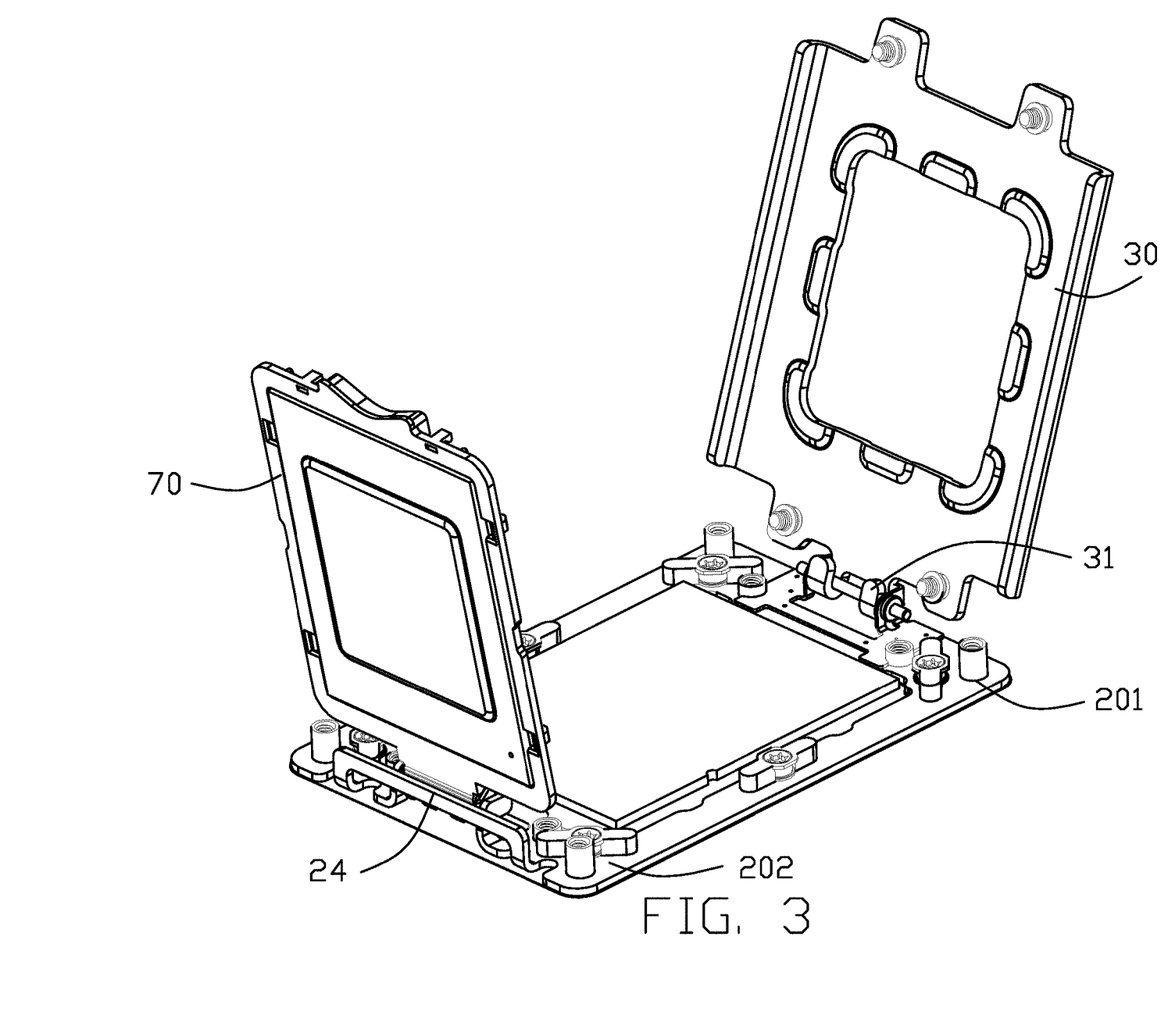
FIG. 3 is another perspective view of the electrical connector of FIG. 2.
Figure 4:
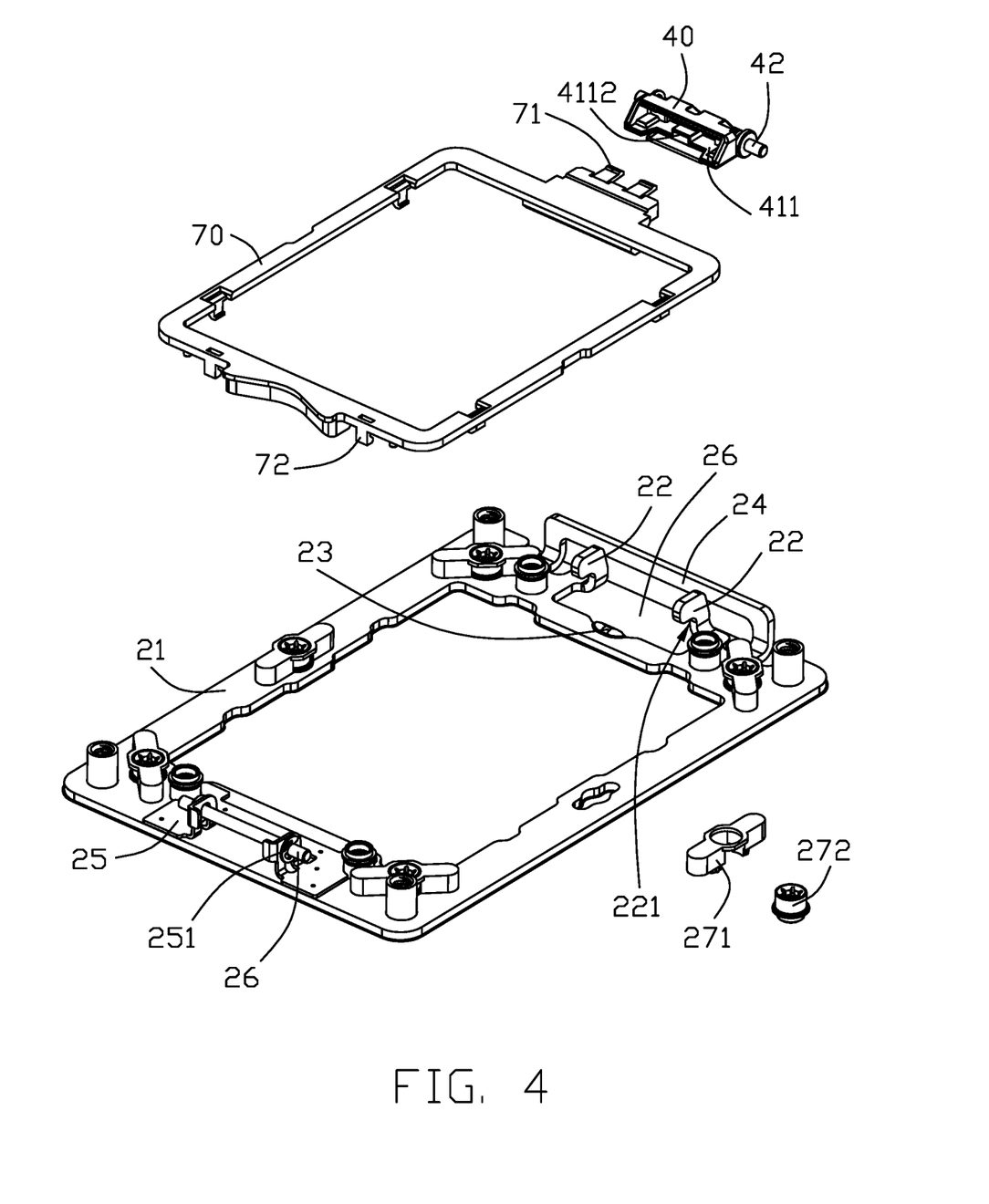
FIG. 4 is an exploded perspective view of the seat frame, the CPU carrier and the rotation mechanism of the electrical connector of FIG. 1.
Figure 5:
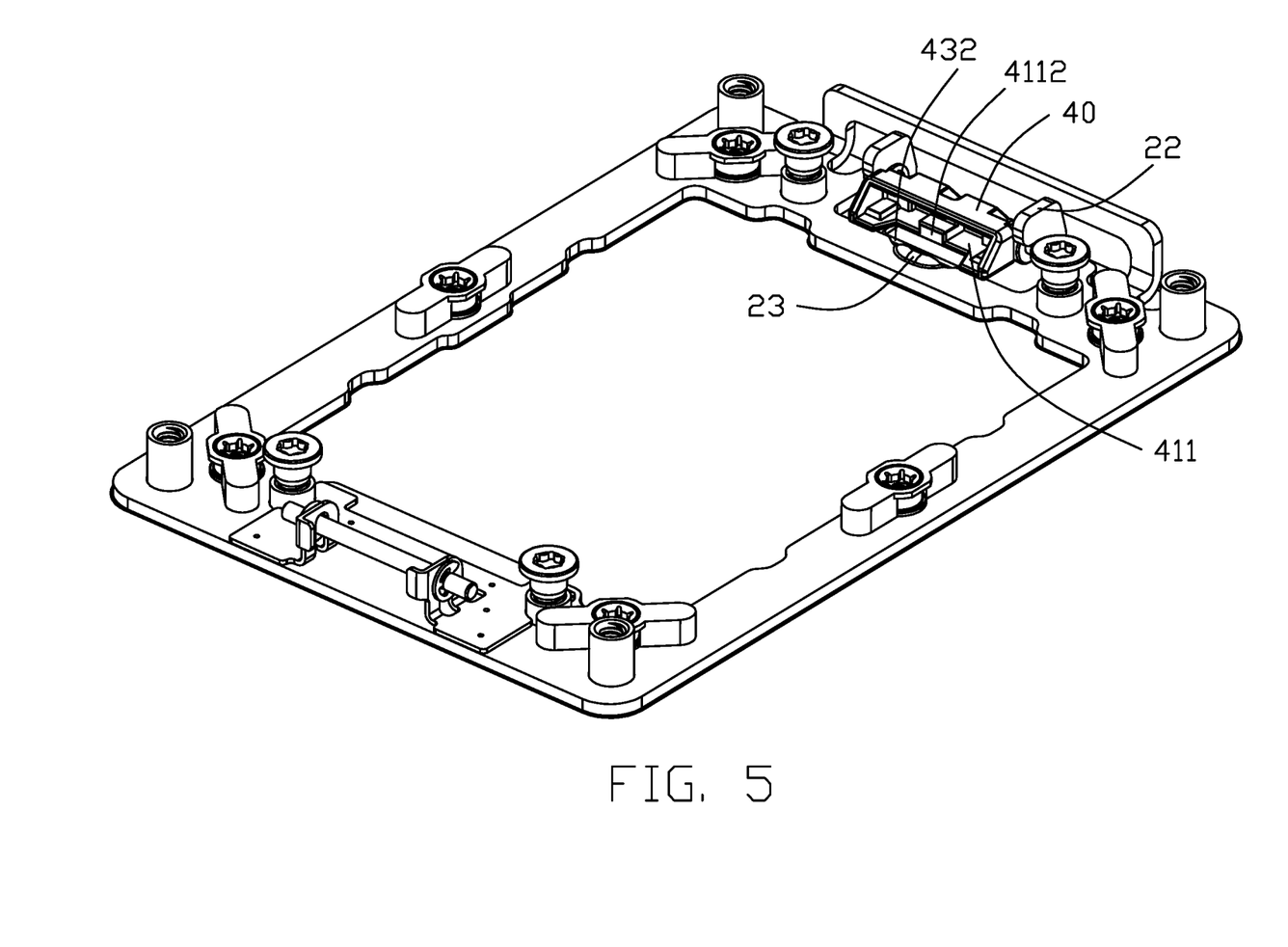
FIG. 5 is a perspective view of the assembled seat frame, the rotation mechanism and the CPU carrier of the electrical connector of FIG. 4.
Figure 6:
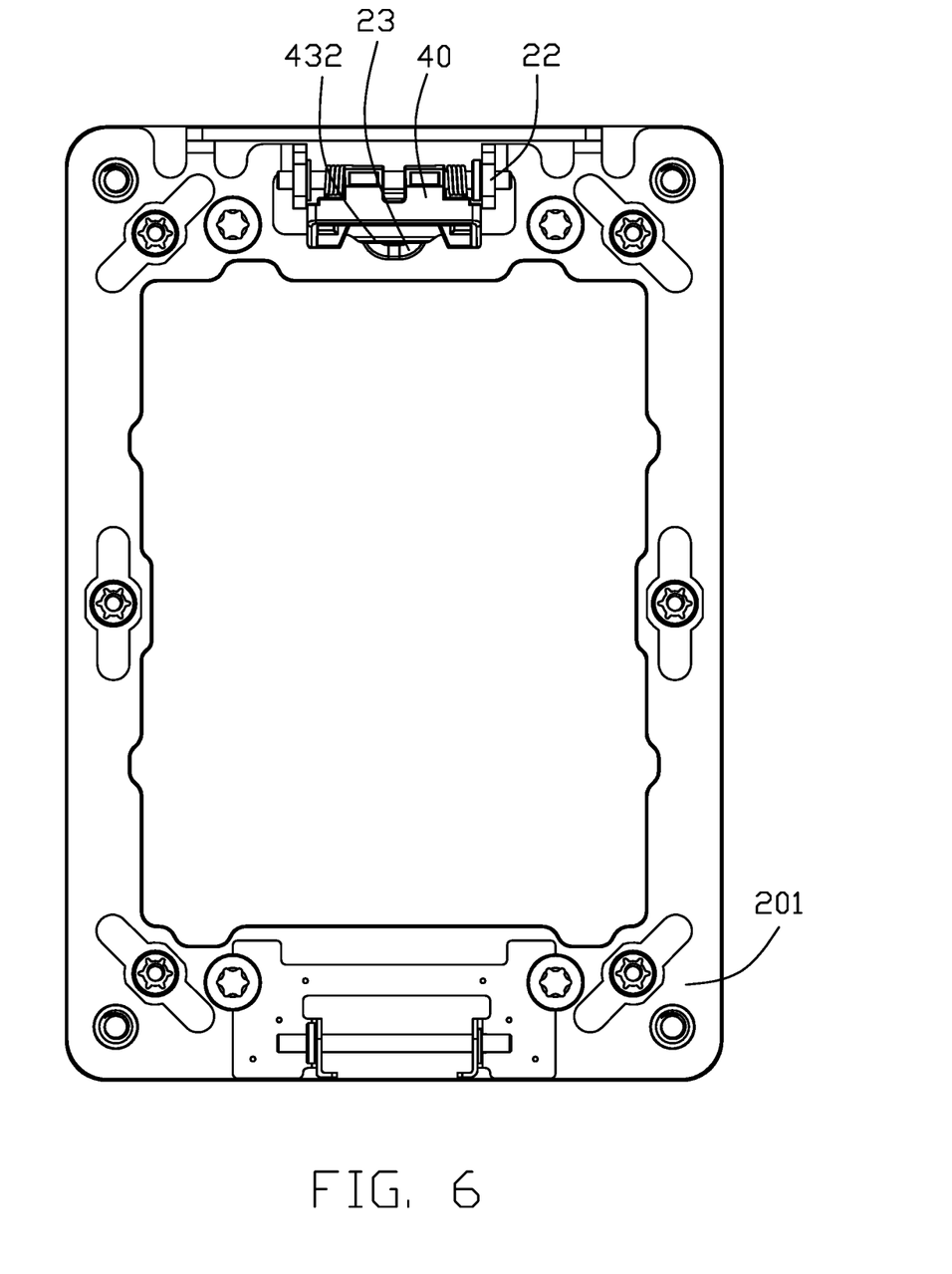
FIG. 6 is a top view of the assembled seat frame, the CPU carrier and the rotation mechanism of the electrical connector of FIG. 5.

After the whole rotation mechanism 40 is pre-assembled, the whole rotation mechanism 40 is downwardly and rearwardly assembled into the space between the pair of supporting arms 22 so as to have two end sections of the pivot 42 is engaged within the corresponding locking recesses 221, and the middle section 432 of the torsion spring 43 engaged with the stopper 23. Therefore, the rotation mechanism 40 is securely assembled to the seat frame 20.

Notably, the locking recess 221 is forwardly open so as to allow the pivot 42 to be rearwardly assembled thereinto along the front-to-back direction conveniently. The plate 21 of the seat frame 20 further includes another stopper 24 behind the pair of supporting arms 22 for preventing excessive outward rotation of the rotation mechanism 40.

A metallic support part 25 discrete from the seat frame 20, is secured to the front end 201 of the plate 21. The support part 25 includes a pair of supporting wings 251 each having a pivot hole to receive another pivot 26. The load plate 30 includes a fixing end 31 holding the pivot 26 so as to have the load plate 30 pivotally mounted to the front end 201. The support wings 251 are associated with stoppers 252 so as to restrict excessive movement of the load plate 30. Understandably, the arrangement between the load plate 30 and the seat frame 20 through the metallic support part 25 is of the traditional way. Anyhow, the arrangement between the rotation mechanism 40 and the seat frame 20 is also applicable to that between the load plate 30 and the seat frame 20.

The plate 21 of the seat frame 20 is associated with the insulative plate 27 on the undersurface so as not to be short with the PCB thereunder. A plurality of insulative bars 271 are located along the seat frame 20 and equipped with corresponding screws to fasten the seat frame 20 upon the PCB. As well know, the operation of the electrical connector 100 includes steps of loading the CPU into the CPU carrier 70, downwardly rotating the CPU carrier 70 against the reaction force derived from the torsion spring 43 until the CPU carrier 70 is moved to the horizontal position, and downwardly rotating the load plate 30 to the horizontal position to downwardly press the CPU 80, and lastly securing the load plate 30 upon the seat frame 20 via corresponding screws (not labeled).

Notably, the feature of the invention is to provide a retention structure unitarily formed on/by the (rear) end region of the seat frame 20 and including a first/rearward stopper 22 and a second/forward stopper 23, with a space therebetween for receiving the rotation mechanism 40, to respectively engage the pivot 42 of the rotation mechanism 40 and the middle section 432 of the torsion spring 43 for not only retaining the rotation mechanism 40 to the seat frame 20 securely but also assembling the rotation mechanism to the seat frame 20 conveniently and easily, compared with the traditional way which is similar to the arrangement between the load plate 30 and the seat frame 20.

What is claimed is:

1. An electrical connector for mounting upon a printed circuit board, comprising:
   a connection main part including an insulative housing with a plurality of contacts therein;
   a metallic seat frame having a one-piece plate that surrounds the connecting main part and defining opposite front and rear ends along a front-to-back direction;
   a metallic load plate pivotally mounted upon the front end;
   a rotation mechanism pivotally mounted upon the rear end; and
   a carrier assembled upon the rotation mechanism and associatively movable along with the rotation mechanism for receiving a central processing unit therein; wherein
   a rear end of the one-piece plate constitutes the rear end of the seat frame and unitarily forms a rearward stopper and a forward stopper with a space therebetween, and the rotation mechanism is as a whole assembled into the space in a secured manner; wherein when assembled, the load plate is positioned upon the carrier in a vertical direction perpendicular to the front-to-back direction.

2. The electrical connector as claimed in claim 1, wherein the rotation mechanism includes an insulative main body, a metallic pivot assembled upon the main body, and a torsion spring assembled upon the pivot, and the rearward stopper engages the pivot while the forward stopper engages the torsion spring.

3. The electrical connector as claimed in claim 2, wherein the torsion spring forms at least a coil and the main body forms at least a hole aligned with the coil in a transverse direction perpendicular to both the front-to-back direction and the vertical direction, and the pivot extends through both the hole and the coil in the transverse direction.

4. The electrical connector as claimed in claim 3, wherein the rearward stopper includes a pair of support arms spaced from each other in the transverse direction to receive the main body therebetween, and each support arm forms a forwardly open locking recess so as to allow the pivot to be rearwardly moved thereinto along the front-to-back direction.

5. The electrical connector as claimed in claim 4, wherein the main body forms a receiving slot to receive an end of the carrier.

6. The electrical connector as claimed in claim 3, wherein the torsion spring includes a pair of coils with a middle section therebetween in the transverse direction, and the middle section engages the forward stopper.

7. The electrical connector as claimed in claim 2, wherein the rear end of the seat frame includes a rear stopper behind the rearward stopper for preventing excessive rotation of the rotation mechanism.

8. The electrical connector as claimed in claim 1, wherein the rearward stopper includes a pair of support arms spaced from each other in a transverse direction perpendicular to the front-to-back direction to receive the main body of the rotation mechanism therebetween, and each support arm forms a forwardly open locking recess so as to allow the pivot to be rearwardly moved thereinto along the front-to-back direction.

9. The electrical connector as claimed in claim 8, wherein the forward stopper is formed by upwardly deforming the one-piece plate.

10. A method of making an electrical connector, comprising steps of:
    providing a connecting main part for mating with a central processing unit;
    providing a metallic seat frame with a one-piece plate to surround the connecting main part;
    providing a metallic load plate pivotally mounted upon a front end of the seat frame in a front-to-back direction;
    unitarily forming a rearward stopper upon a rear end of the one-piece plate of the seat frame via stamping and bending said one-piece plate;
    unitarily forming a forward stopper via upwardly deforming the one-piece plate in front of the rearward stopper;
    providing a pre-assembled rotation mechanism with an insulative main body, a metallic pivot assembled upon the main body, and a torsion spring upon the pivot; and
    assembling the pre-assembled rotation mechanism into a space defined between the rearward stopper and the forward stopper.

11. The method as claimed in claim 10, wherein the rearward stopper includes a pair of support arms to receive the main body of the rotation mechanism therebetween in a transverse direction perpendicular to the front-to-back direction.

12. The method as claimed in claim 11, wherein the rotation mechanism is assembled into the space downwardly and rearwardly.

13. The method as claimed in claim 12, wherein the pivot is engaged with the rearward stopper while the torsion spring engages the forward stopper.

14. The method as claimed in claim 13, wherein the torsion spring includes a pair of coils with a middle section therebetween in the transverse direction, and the main body defines a pair of through holes aligned with the pair of coils in the transverse direction to have the pivot extend therethrough commonly, and the middle section engages the forward stopper.

15. An electrical connector for mounting upon a printed circuit board, comprising:
- a connection main part including an insulative housing with a plurality of contacts therein;
- a metallic seat frame having a one-piece plate that surrounds the connecting main part and defining opposite front and rear ends along a front-to-back direction;
- a metallic load plate pivotally mounted upon the front end;
- a rotation mechanism pivotally mounted upon the rear end; and
- a carrier assembled upon the rotation mechanism and associatively movable along with the rotation mechanism for receiving a central processing unit therein; wherein
- a rear end of the one-piece plate constitutes the rear end of the seat frame and unitarily forms a pair of support arms with a space therebetween in a transverse direction perpendicular to the front-to-back direction, and the rotation mechanism includes an insulative main body, a metallic pivot assembled to the main body, and a torsion spring assembled upon the pivot and is as a whole assembled into the space in a secured manner; wherein
- when assembled, the load plate is positioned upon the carrier in a vertical direction perpendicular to both the front-to-back direction and the transverse direction.

16. The electrical connector as claimed in claimed in claim 15, wherein said one-piece plate unitarily forms a forward stopper to engage the torsion spring while said support arms engage the pivot.

17. The electrical connector as claimed in claim 15, wherein each support arm forms a forwardly open locking recess so as to allow the pivot to rearwardly move thereinto.

18. The electrical connector as claimed in claim 15, wherein the one-piece plate further includes a rear wall, and a rear stopper is formed on the rear wall for preventing excessive rotation of the rotation mechanism.

* * * * *